United States Patent [19]
Zommer

[11] Patent Number: 4,860,072
[45] Date of Patent: Aug. 22, 1989

[54] MONOLITHIC SEMICONDUCTOR DEVICE AND METHOD OF MANUFACTURING SAME

[75] Inventor: Nathan Zommer, Palo Alto, Calif.

[73] Assignee: IXYS Corporation, San Jose, Calif.

[21] Appl. No.: 166,809

[22] Filed: Mar. 10, 1988

Related U.S. Application Data

[63] Continuation of Ser. No. 836,314, Mar. 5, 1986, abandoned.

[51] Int. Cl.$^4$ ............................................. H01L 29/78
[52] U.S. Cl. ................................. 357/23.8; 357/23.4; 357/41; 357/43; 357/55; 357/86
[58] Field of Search ........................ 357/23.4, 23.8, 41, 357/43, 55, 86

[56] References Cited

U.S. PATENT DOCUMENTS

| | | | |
|---|---|---|---|
| 4,199,774 | 4/1980 | Plummer . | |
| 4,344,081 | 6/1982 | Pao et al. . | |
| 4,574,209 | 3/1986 | Lade et al. | 357/23.8 |
| 4,593,458 | 6/1986 | Adler | 357/23.8 |

OTHER PUBLICATIONS

Sigg, Hans, J., et al., "D-MOS Transistor for Microwave Applications", *IEEE Transactions on Electron Devices* (Jan. 1972) ED-19(1):45-53.
Krausse, J., et al., "Power MOS FETs Run Directly Off TTL", *Electronics* (Aug. 28, 1980) pp. 145-147.
Lin, H. C., et al., "Optimum Load Device for DMOS Integrated Circuits", *IEEE Journal of Solid-State Circuits* (Aug. 1976) SC-11(4):443-452.
Pocha, M. D., et al., "A Computer-Aided Design Model for High-Voltage Double Diffused MOS (DMOS) Transistors", *IEEE Journal of Solid-State Circuits* (Oct. 1976) SC-11(5):718-726.
M. D. Pocha, R. W. Dutton, "A Computer-Aided Design Model for High-Voltage Double Diffused MOS (DMOS) Transistors", Oct., 1976 *IEEE Journal of Solid State Circuits*, vol. SC-11 No. 5.

*Primary Examiner*—Edward J. Wojciechowicz
*Attorney, Agent, or Firm*—Townsend and Townsend

[57] ABSTRACT

A monolithic semiconductor device for use in various applications such as lateral and vertical MOS transistors, insulated gate conductivity modulated devices and the like together with a method of manufacturing same. The device includes source, body and drain regions, with the body region including a channel section which is disposed adjacent an insulated gate formed on the surface of the device. The source region includes a central contact area flanked by a pair of body segments which extend up through the source region and which create a resistive path between the source contact area and the channel section. A voltage is developed across the resistive path which tends to maintain a parasitic bipolar transistor formed by the source, body and drain regions in a non-conductive state. A source metallization bridges the two body segments and the intermediate source contact thereby shorting the body region to the source. The geometry of the device is reduced in that width of the source contact area need not be increased to ensure that the source metallization contacts both the source and the body region.

30 Claims, 4 Drawing Sheets

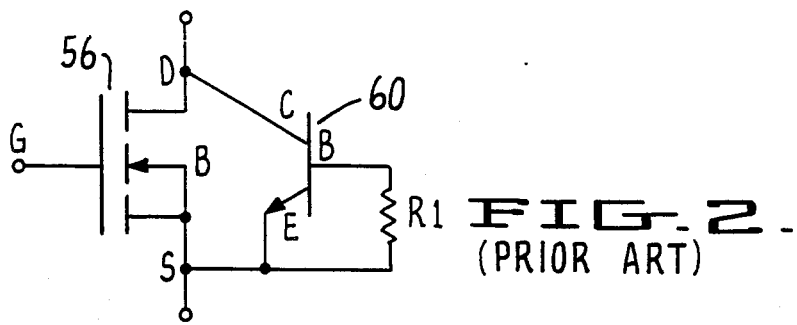
FIG_2. (PRIOR ART)
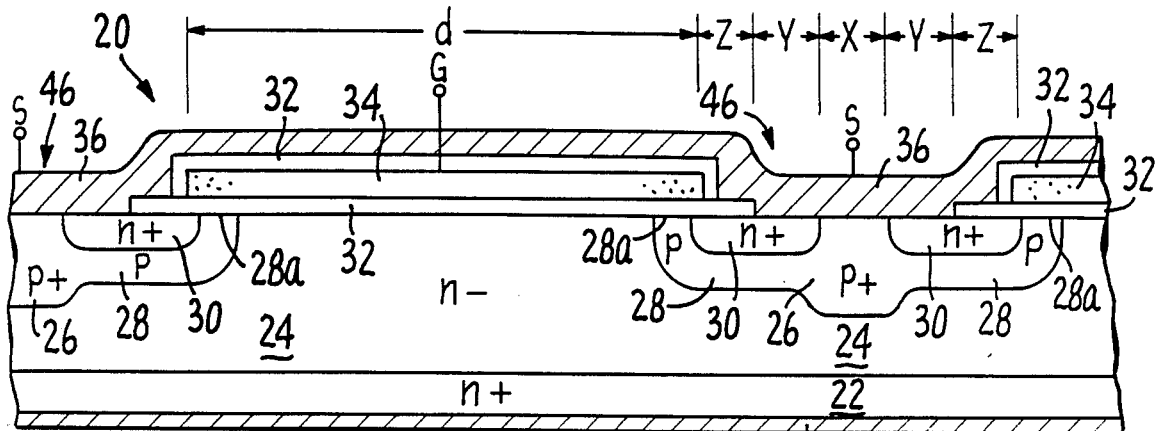
FIG_1. (PRIOR ART)
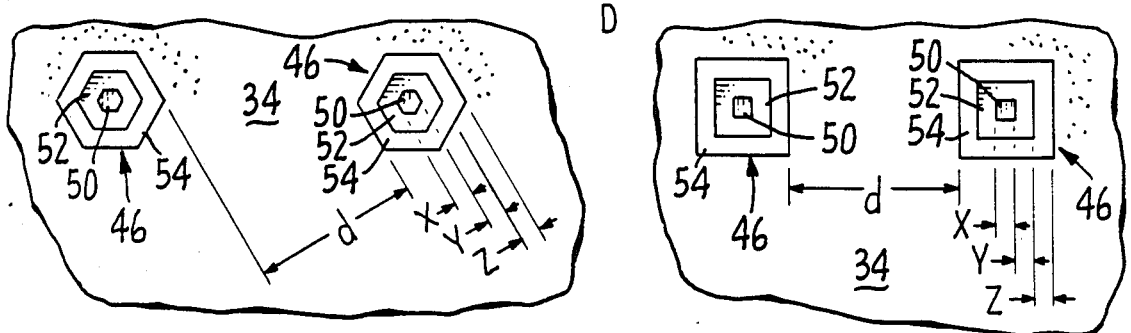
FIG_3. (PRIOR ART)
FIG_4. (PRIOR ART)
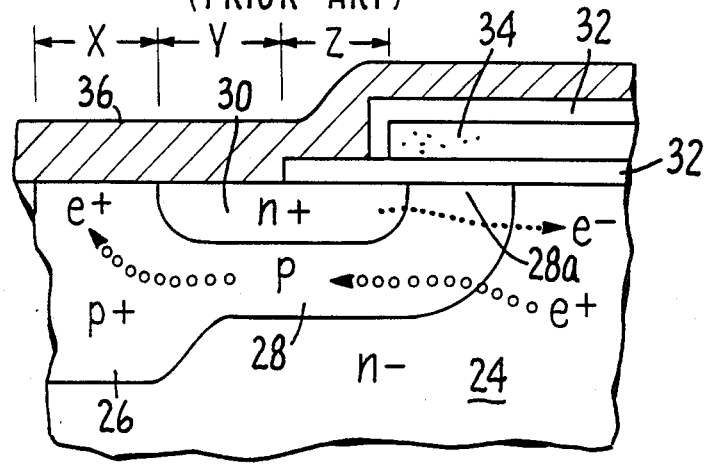
FIG_5. (PRIOR ART)
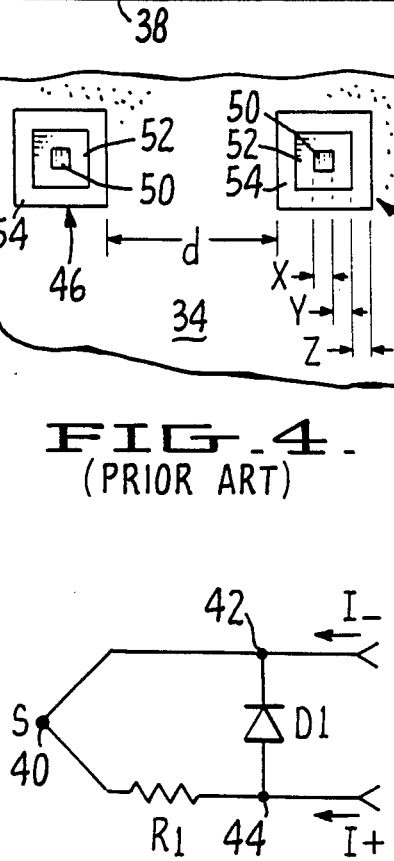
FIG_6. (PRIOR ART)

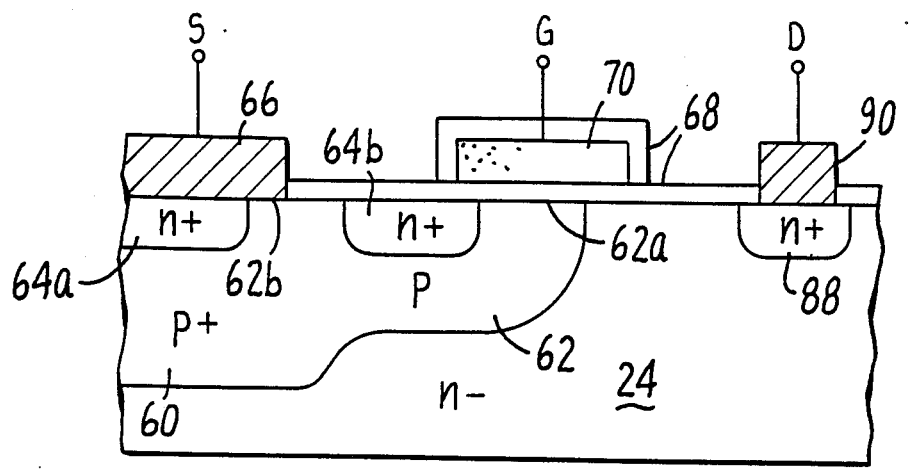
FIG_13.
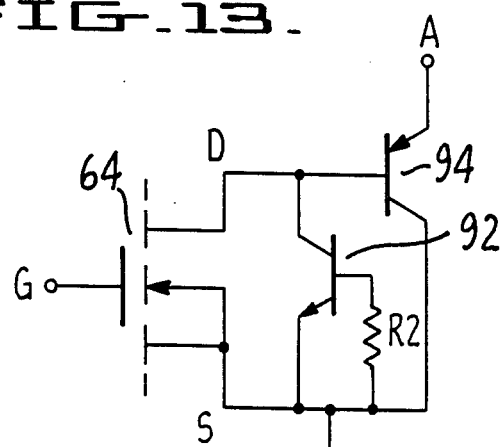
FIG_14.
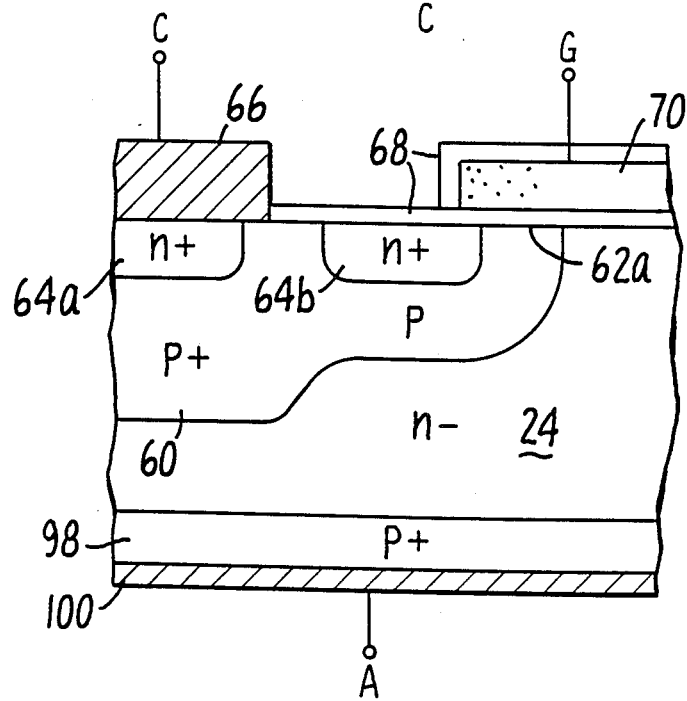
FIG_15.

MONOLITHIC SEMICONDUCTOR DEVICE AND METHOD OF MANUFACTURING SAME

This is a continuation of application Ser. No. 836,314, filed 3-5-86, now abandoned.

TECHNICAL FIELD

The present invention relates generally to semiconductor devices and methods of manufacturing same, and more particularly to insulated gate devices, such as MOS transistors and conductivity modulated devices.

BACKGROUND ART

Metal oxide semiconductor (MOS) transistors and similar insulated gate monopolar devices can be grouped as either enhancement-mode or depletion-mode devices. Depletion-mode devices inherently include a pair of P/N junctions which form a parasitic bipolar transistor. In most applications, it is imperative that the parasitic transistor not turn on during operation of the monopolar device, otherwise switching speed of the device is degraded.

Recently developed insulated gate conductivity modulated devices also have an inherent parasitic bipolar transistor which must be prevented from turning on. The devices include a MOS transistor which provides base drive to a non-parasitic bipolar transistor. In the event the parasitic transistor does turn on, the primary bipolar device will become latched in the on state which, in most applications, will result in destruction of the device.

Attempts have been made to minimize the likelihood that the parasitic transistor will become turned on. Typically, the source electrode of the MOS device shorts the source to the body region of the device. This effectively shorts the base and emitter of the parasitic transistor together at the surface of the device. However, because of series resistance in the device body, other portions of the base and emitter are not shorted, but rather have a relatively high impedance bridging the two elements. A highly doped region can be added to reduce the effective resistance of the bridging impedance. However, the highly doped region cannot be located in proximity to the channel region in the body without adversely affecting the breakdown voltage of the device. Accordingly, there remains a significantly high resistance which permits the parasitic transistor to be turned on under certain operating conditions.

The present invention overcomes the above-noted limitations of conventional insulated gate semi-conductor devices. The effective resistance between the emitter/base of the parasitic transistor is reduced substantially without degrading breakdown voltage performance. In addition, a ballast voltage is generated in the device which opposes the voltage tending to turn on the parasitic transistor. In addition, the dimensions of the device are significantly smaller than those of conventional devices so that production yields per wafer are increased. These and other advantages of the present invention will become apparent to those skilled in the art upon a reading of the following Best Mode For Carrying Out The Invention together with the drawings.

DISCLOSURE OF THE INVENTION

A monolithic semiconductor device for use in various applications such as a lateral and vertical MOS transistors, insulated gate conductivity modulated devices and the like is disclosed. A method for fabricating the device is also disclosed.

The device includes a semiconductor body, preferably silicon, having first and second generally parallel major surfaces. A first region is disposed in the body of a first conductivity type, the first region including a channel section and a spaced-apart intermediate section, both abutting the first surface of the semiconductor body. The channel section preferably extends completely around the periphery of the first region.

A second region of a second conductivity type, opposite of the first type, is disposed in the body. The second region is bounded by the first region and includes a peripheral section located between the channel and intermediate sections of the first region and abutting the first surface of the body. The second region further includes a contact section, also abutting the first surface, with the intermediate section being positioned between the peripheral and contact sections.

An insulating layer is disposed over the channel section on the first surface and a first electrode is located on the layer above the channel section. The electrode functions as the gate electrode of the device. A first ohmic contact is formed on the contact section. The ohmic contact typically includes an electrode which functions as the source electrode.

Preferably, a third region of the second conductivity type is also formed in the semiconductor body which bounds the first region and which includes a drift section adjacent the channel section, opposite the peripheral section. In the event a lateral MOS transistor is to be fabricated, a second ohmic contact is formed in the third region in the first major surface of the semiconductor body, separated from the channel section by a third region drift section. The second ohmic contact typically includes an electrode which functions as the drain electrode. If a vertical MOS transistor is desired, the second ohmic contact is formed in the third region at the second major surface of the body.

An insulated gate conductivity modulated device can be produced by adding a fourth region of the first conductivity type, intermediate the third region and the second major plane of the body. An ohmic contact is then formed in the fourth region at the second major plane.

BRIEF DESCRIPTION OF THE DRAWINGS

FIG. 1 is an elevation cross-sectional side view of a conventional power MOS comprised of individual cells of vertical MOS devices connected to a common drain electrode.

FIG. 2 is a schematic diagram of a simplified equivalent circuit for a conventional double diffused MOS transistor showing the location of the parasitic bipolar transistor.

FIGS. 3 and 4 are plan views of a power MOS transistor showing hexagonal and square cell configurations, respectively.

FIG. 5 is an elevation cross-sectional view of a segment of a conventional MOS transistor, showing details of the source/gate region.

FIG. 6 is a schematic diagram of a simplified equivalent circuit of a conventional MOS device showing the base/emitter junction of the parasitic transistor and associated resistance.

FIG. 13 is an elevation cross-sectional view of a segment of a lateral MOS device incorporating the subject invention.

FIG. 14 is a schematic diagram of a simplified equivalent circuit for an insulated gate conductivity modulated device.

FIG. 15 is an elevation cross-sectional view of a segment of an insulated gate conductivity modulated device incorporating the subject invention.

BEST MODE FOR CARRYING OUT THE INVENTION

Figure 7:
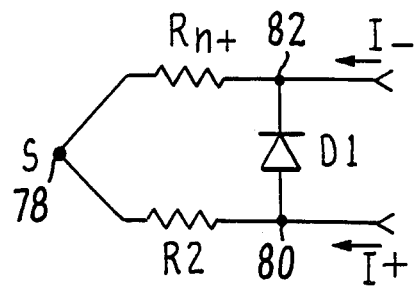
FIG. 7 is a schematic diagram of a simplified equivalent circuit of a MOS device in accordance with the subject invention showing the base/emitter junction of the parasitic transistor and associated resistances.

Referring now to the drawings, FIG. 1 shows a schematic representation (not to scale) of a conventional N channel MOS transistor (MOSFET), generally designated by the numeral 20. The MOSFET depicted is a double diffused N channel vertical enhancement mode MOSFET, particularly suitable in power applications.

A single power transistor typically includes several hundred to several thousand low-current cells coupled in parallel to form a transistor having high current capabilities. Each cell includes a source electrode in the form of a source metallization 36 surrounded by a gate electrode 34. All the cells are coupled to a common drain electrode 38 which, in the case of a vertical MOS device, is formed at the bottom of the die. A single cell can function alone as a low current MOSFET. FIG. 1 shows approximately one and one-half cells 46.

MOSFET 20 is fabricated from a silicon wafer which is heavily doped N+. A lightly doped N− expitaxial layer 24 is formed on the N+ substrate 22. A thin oxide layer is formed on which a silicon nitride layer is deposited and patterned to define the active area. Then, the gate oxide is formed on which polysilicon 34 is deposited and patterned to define the P well area. Then, using the polysilicon as a mask, a shallow and light P doping by ion implantation is deposited followed by a heavier, relatively deep, P+ implant. A single diffusion step is then performed to form regions 28 and 26, respectively. An oxide layer 32, having a central opening associated with each cell, functions as a diffusion mask for P diffusion 28. As shown in FIG. 1, diffusion 28 migrates laterally under the oxide and polysilicon layer to form a short channel section 28a which extends around the periphery of the cell.

Diffusion 28 is followed b an N+ diffusion 30 utilizing an oxide mask. Diffusion 30 also extends laterally under the oxide and polysilicon layer, but to a lesser extent than diffusion 30. Channel section 28a is formed under oxide layer 32, intermediate N+ region 30 and epitaxial N− layer 24. N+ region 30, which abuts the top surface of the wafer, forms the source region of the cell. A segment of P+ region 26 extends up through N+ region 30 to form a contact area for the body section of the cell. A source metallization 36 is formed over the exposed portion of the N+ source region 30 and P+ body region of each cell so as to provide a common source electrode. The highly doped silicon in combination with a metallization layer form an ohmic (substantially non-rectifying) contact.

The polysilicon functions as a gate 34 and is positioned over channel section 28a and is insulated from the channel section by oxide layer 32. Gate electrode 34 extends over the surface of the device so as to form a common gate electrode for all cells 46 of the device. A metallization layer 38 is formed on the back of the die to form a drain electrode common to each cell 46 of the device.

When a positive potential is applied to the gate electrode 34, with respect to source electrode 36, electrons in body region 28 are attracted to the gate electrode. As is well known, the excess of electrons cause the channel section 28a immediately below the gate electrode to invert from P to N type conductivity, thereby forming an electrical path between the source and drain. When the gate potential is removed, the inversion layer disappears and section 28a is no longer conductive.

The FIG. 1 device and similar short channel MOS devices are plagued with a parasitic bipolar transistor which is in parallel with the MOS device. In the case of the N channel MOS device depicted, the parasitic transistor is an NPN transistor. Source region 30 forms the emitter of the transistor, with regions 26/28 and 22/24 forming the base and collector of the transistor, respectively. If the MOS device is P channel, the parasitic transistor is type PNP.

FIG. 2 schematically depicts the relationship between the N channel MOS transistor 56 and associated parasitic NPN bipolar transistor 60. It can be seen that the drain and collector of the two respective devices are effectively shorted as are the source and emitter. The base (MOS body) of the bipolar transistor is connected to the emitter (MOS source) through an effective resistance represented by resistor $R_1$.

In the event current through resistor $R_1$ is sufficiently large to forward bias the emitter/base junction of transistor 60 (about 0.7 volts), transistor 60 will turn on. This may occur because of current coupled to resistor R1 by way of the effective drain region 24 to body region 26/28 junction capacitance. In the event parasitic transistor 60 is permitted to turn on while MOS transistor 56 is conducting, the relatively slow turn-off time of the bipolar device will seriously degrade operation of the MOS device. As will subsequently be described, in some instances the MOS device may be destroyed in the event the parasitic transistor is permitted to turn on.

The conventional approach to reducing the likelihood of parasitic transistor turn on is to reduce the value of resistor $R_1$. As can be seen in FIG. 1, the source region 30 and body region 26 of the MOS transistor are shorted by metallization 36. This technique is almost universally used in such power MOS devices. In addition, the highly doped P+ region 26 has a tendency to reduce $R_1$. Nevertheless, the metallization short and highly doped region 26 are both disposed a substantial distance from channel section 28a where the channel is induced. There is, therefore, a significant series resistance in body region 28 which cannot be completely eliminated by either the surface short or highly doped region 26.

Another disadvantage of conventional power MOS transistor is that the individual cells occupy a relatively large area. As is well known, minimum feature dimension in a semiconductor fabrication processes must allow for worst case processing and mask alignment tolerances. By way of example, in a typical process, the design rules provide that the minimum dimension permitted is 4 microns ($4 \times 10^{-6}$ meters). Referring again to FIG. 1, the P+ diffusion opening width for forming region 26 is designated by the letter X. This minimum distance is required to ensure a connection between metallization 36 and body region 26. In order to also ensure that the N+ source region 30 contacts the source metallization 36, the region must extend a a minimum distance from the edge of oxide layer 32 represented by letter Y. Also, in order to ensure that the source metallization 36 does not also contact polysilicon gate 34, the two elements must be separated a minimum distance represented by the letter Z. Finally, in order to insure the depletion zone in region 24 of one cell 46 does not reach the depletion zone of an adjacent cell 46, the cells must be spaced apart a distance represented by the letter D, which is the distance between the edges of the polysilicon gate 34 at each cell.

FIGS. 3 and 4 show the cell layout for two conventional MOS cell designs. The FIG. 3 design utilizes a hexagonal cell configuration. The inner segment 50 correspond to the P+ body diffusion window and has a width X. Intermediate segment 52 indicates the metallization overlap over the N+ source region and has a width Y. Outer segment 54 indicates the spacing Z between the polysilicon gate electrode and the source metallization. As shown, the cell spacing is the width D of the polysilicon 34 between adjacent cells.

It can be seen that the cell width is equal to total distance X+2Y+2Z. Assuming that the applicable design rules are 4 microns, the total cell width is 20 microns. Dimension D between adjacent cells is typically 26 microns so that the cell pitch is 46 microns. The FIG. 4 cell pitch is also 46 microns for the same design rules. Thus, it can be seen that conventional MOS designs require a substantial amount of wafer area.

Figure 8:
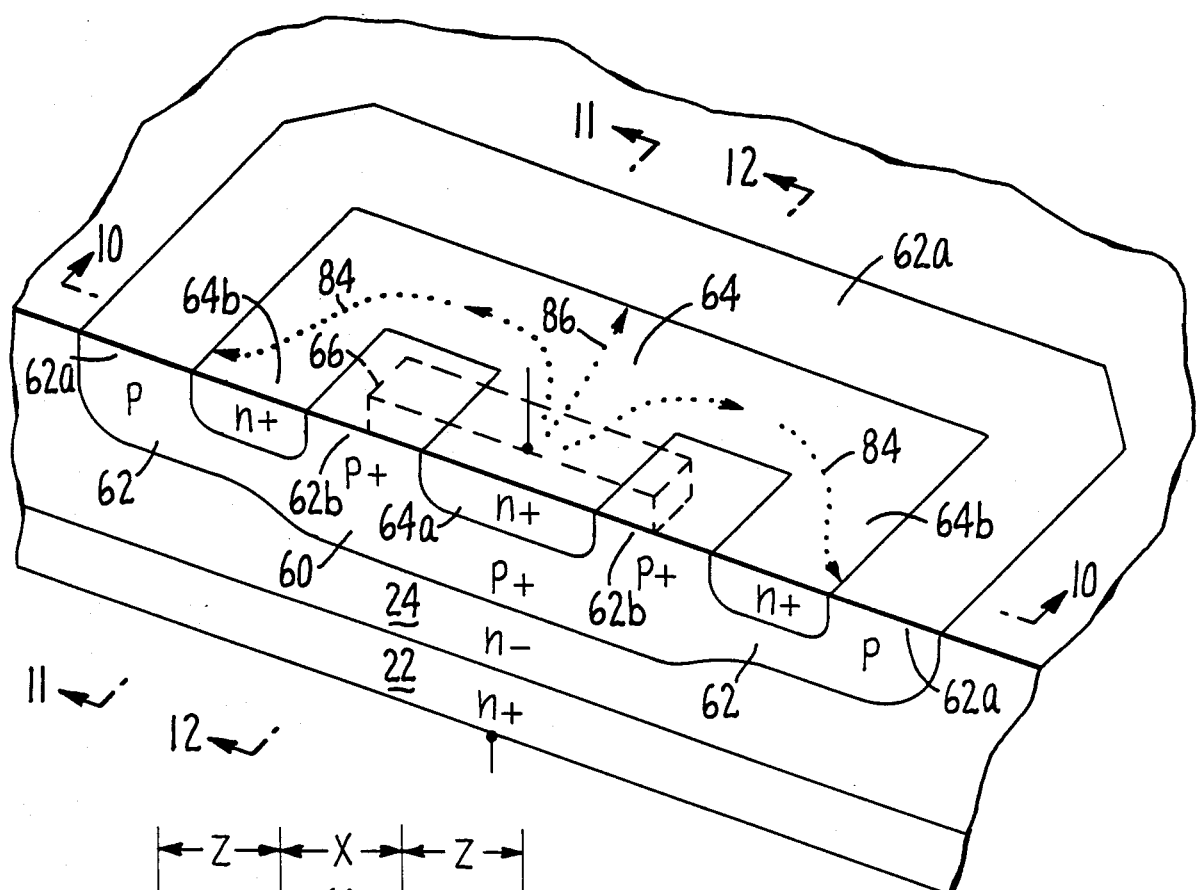
FIG. 8 is a perspective cross-sectional view of a vertical MOS device incorporating the subject invention with the source metallization, gate electrode and related structure removed.

Having described in some detail the shortcomings of conventional MOS designs, the present invention and the advantages of such invention will now be described. Referring again to the drawings, FIG. 8 is a perspective sectional view (not to scale) of an exemplary embodiment of the subject invention. The FIG. 8 embodiment is an N channel doubled diffused vertical MOS cell which may function alone as a low current MOS transistor or together with other cells to form a high current MOS transistor. It will become apparent to those skilled in the art that the present invention is equally applicable to other types of MOS devices, including P channel devices, lateral devices, insulated gate conductivity modulated (IGCM) devices and the like.

In order to better illustrate the geometry of the various diffusions which form the FIG. 8 embodiment, the source and drain metallizations are not depicted nor are the gate electrode or the various oxide layers. The general steps for forming the various diffusions are similar to those utilized in a conventional MOS device, although the geometries of the diffusions are quite different.

As the case with the previously-described conventional MOS device, fabrication of the FIG. 8 device begins with a silicon substrate 22 of N+ doping. An expitaxial layer 24 of N− material is formed on substrate 22 followed by oxidation to create the field oxide and etching to define the active area. The polysilicon 70 is then deposited and patterned to define the P well area. Next, a P/P+ doped region 62 is formed over region 60 to form a body region which includes a channel section 62a which extends around the periphery of region 60. Region 62 has a generally octagonal shape at the surface of the semiconductor.

An N+ source region 64 is then diffused into, and is bounded by, body region 62. When source region 64 is formed, two sections of the underlying P+ body region 62 are masked so that a pair of spaced-apart segments 62b of P+ material extend from body region 60 to the top surface of the wafer. A contact section 64a of the N+ source region is disposed between the two P+ segments 64b, sometimes referred to as intermediate sections.

Figure 10:
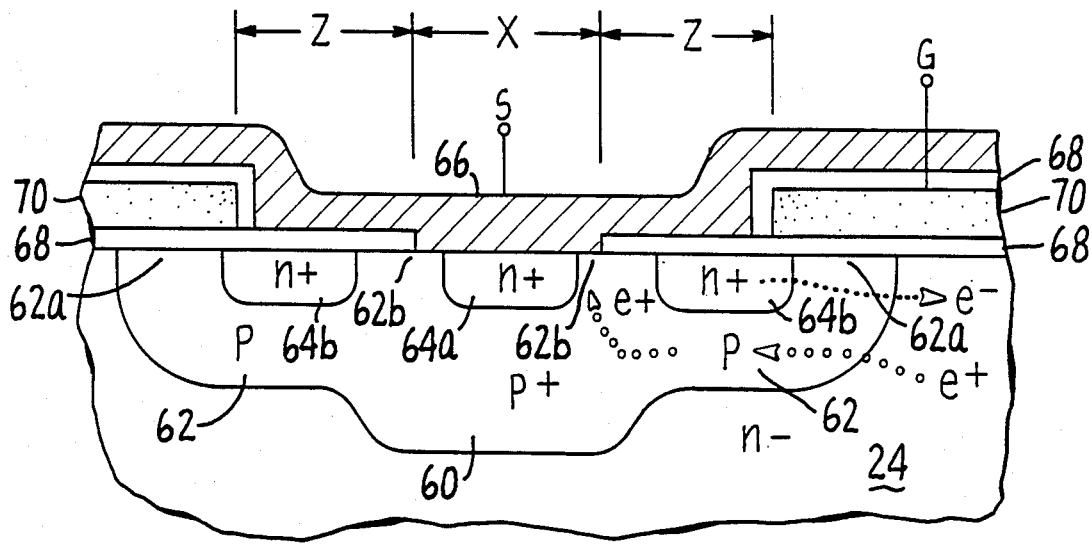
FIG. 10 is an elevation cross-sectional view of an MOS transistor, taken through section line 10-10 of FIG. 8, in accordance with the subject invention.
Figure 11:
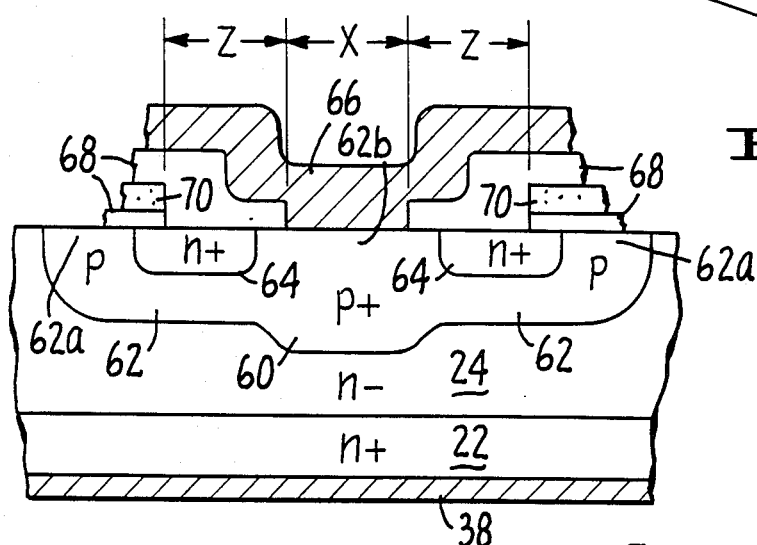
FIG. 11 is a cross-sectional view of the MOS device of FIG. 8 taken through section line 11-11.
Figure 12:
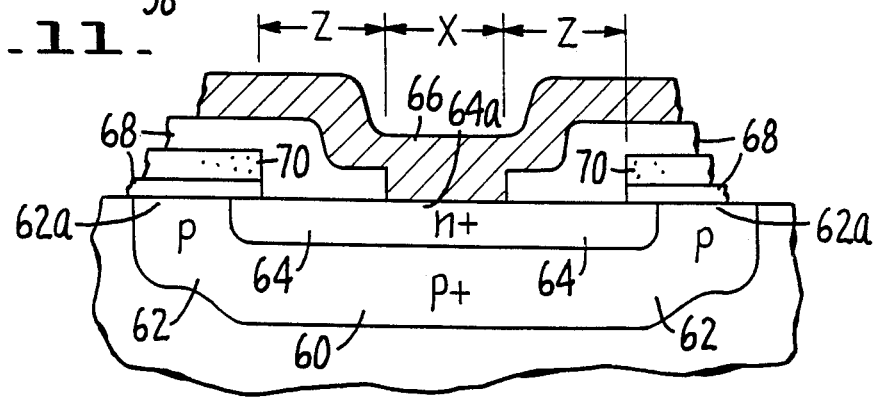
FIG. 12 is a cross-sectional view of the MOS device of FIG. 8 taken through section line 12-12.

As can be seen in FIGS. 10, 11 and 12, which are further cross-sectional views of the FIG. 8 device, an oxide layer 68 extends over the surface of the wafer. A contact opening for a source metallization 66 is formed in the oxide layer above the two sections 62b of the P+ body region, sometimes referred to as peripheral sections, (FIGS. 10 and 11) and above the contact section 64a of the N+ source region (FIG. 12). Body region 62 and source region 64 both utilize oxide layer 70 as a mask so that lateral diffusion causes channel section 62a to be formed under oxide layer 70 in the same manner as previously described in connection with the conventional FIG. 1 device.

The polysilicon gate electrode 70 is disposed above the channel section 62a of the body region, insulated from the channel section by oxide layer 68. The source metallization 66 and polysilicon 70 extend across the top surface of the die, insulated from one another by oxide layer 68. Metallization 66 and polysilicon 70 interconnect the source and gate electrodes, respectively, of the cells which comprise the power MOS transistor. Metallization 38 is formed on the underside of the die (FIG. 11) to provide a drain electrode common to each cell of the power device.

The novel structure disclosed in FIGS. 8–12 provides an improvement in several respects over conventional the MOS structure depicted in FIG. 1. FIG. 6 is a simplified schematic diagram of the conventional FIG. 1 structure showing the interconnection between the base/emitter junction of the parasitic transistor 60 (FIG. 2) and the associated resistance $R_1$.

Diode $D_1$ represents the base/emitter junction of the parasitic transistor. The anode of diode $D_1$, at node 44, represents the P+/P body region 26/28/28a of the MOS structure, as can be seen in FIG. 5. The cathode of the diode, at node 42, represents the N+ source diffusion 30 of the device. Node 40 represents the source metallization 36.

Parasitic transistor 60 will remain turned off provided $D_1$ does not become forward biased. As indicated by the FIG. 6 diagram, there is a first current path from cathode node 42 to source node 40 and a second path from anode node 44 to source node 40. The path between nodes 42 and 40 carry electron current represented by I− and the path between nodes 44 and 40 carry hole current represented by I+. The arrows represent conventional current flow direction.

As can be seen from the FIG. 5 diagram, the N+ source region 30, adjacent the body region 28/28a, is connected directly to the source metallization. Thus, there is a very small resistance between the source region and cathode of diode $D_1$, as represented by the short circuit between nodes 40 and 42 of the FIG. 6 diagram.

As can also be seen in FIG. 5, the holes injected from the drain drift region in epitaxial layer 24 into the P body region 28/28a must travel a significant distance through the P+ and P regions 26, 28/28a to reach the source metallization 36. The effective resistance is represented by resistor $R_1$ connected between nodes 40 and 44.

Although the presence of the P+ region 26 tends to reduce the value of R1, the value remains significant and there is a substantial possibility that the parasitic transistor will become turned on. Referring now to FIG. 7, a simplified schematic diagram of an equivalent circuit of the FIGS. 8-12 structure is shown. Diode $D_1$ again represents the base/emitter junction of the parasitic transistor. Node 80, at the diode $D_1$ anode, is located at the P channel section 62a of the device. Node 80 is coupled to the source metallization 66 at node 78 through resistance $R_2$. As can best be seen in FIG. 10, resistance $R_2$ is formed by the P+ and P body regions 60 and 62/62a between source metallization 66 and the drain drift region, adjacent channel section 62a, in epitaxial layer 24. Current flow through resistance $R_2$ is in the form of positive (hole) carriers, since the flow is through material of P type conductivity, and is represented by I+.

As also shown in the FIG. 7 diagram, there is a significant series resistance $R_{N+}$ located between nodes 82 and 78. This resistance, which is not present in conventional MOS devices such as depicted in the diagram of FIG. 6, is formed in the N+ source region 64 between the channel section 62a and the junction between source metallization 66 and contact section 64a. Current flow through resistance $R_{N+}$ is in the form of negative (electron) carriers and is represented by I−.

Lines 84 and 86 in FIG. 8 represent the electron path (opposite of conventional current flow) from the source metallization 66 to channel section 62a. The presence of the two P type peripheral sections 62b increase the effective current path length, as represented by lines 84, and also cause current crowding in the region intermediate the two P sections in the area of line 86.

As can be seen from the FIG. 7 diagram, the electron flow I− through resistance creates a voltage drop which opposes the drop across resistance $R_2$ and thus tends to reverse bias diode $D_1$ thereby causing the parasitic transistor to remain turned off. In addition, the resistance $R_2$ is significantly smaller than that of $R_1$ (FIG. 6) of conventional devices. This latter feature, which will be subsequently explained in greater detail, also reduces the likelihood of parasitic transistor turn on.

A further advantage of the present invention is that the dimensions of the individual cells are substantially smaller than that of conventional devices. As previously noted in connection with FIGS. 1 and 5, conventional devices require that the source metallization 36 extend past the body region 26 by a distance Y to ensure a connection between the N+ source 30 and the metallization. The requirement of the Y length overlap increases the width of the cell by a factor of 2Y.

The present invention does not require the addition of a Y length overlap to ensure that the source metallization contacts both the source and body region. As can be seen in FIG. 8, since the source metallization 66 contacts the two P+body region peripheral sections 62b, the intermediate N+ contact section 64a will also be contacted.

FIG. 11 and 12 depict the source metallization 66 contact to the P+ body regions 62b and N+ source region 64a, respectively. As can be seen, the total width of the source metallization contact with the device surface is X rather than X+2Y. The polysilicon gate 70 is still spaced a distance Z from the source metallization 66 so that the total cell width is X+2Z.

Figure 9:
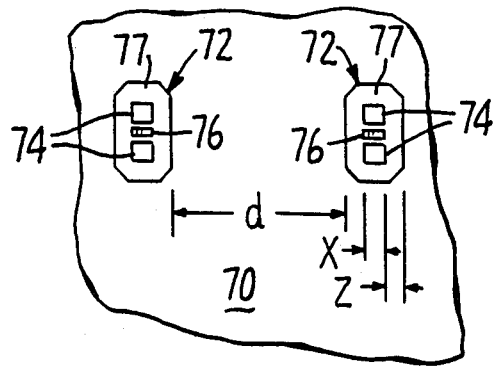
FIG. 9 is a plan view of a power MOS transistor incorporating the subject invention showing two cells having a hexagonal configuration.

The foregoing can be further illustrated by reference to FIG. 9 which shows a pair of cells, generally designated by the numeral 72, in accordance with the present invention. Regions 74 represent the two spaced-apart P+ body regions 62b contact areas in the oxide. Region 76 represents the N+ source contact area 64a, intermediate regions 62b. Region 77 represents the N+ source 64 area covered by oxide which separates the source metallization 66 from the polysilicon gate 70 surrounding each cell. As is well known, reduced cell dimensions also permit the cell spacing D to be reduced so as to achieve an optimum design, including minimum on resistance. Assuming that the minimum distance D between cells is 20 microns and the design rules are 4 microns, the cell pitch is 32 microns in comparison to a pitch of 46 microns for the previously-described conventional devices.

As previously noted, the present invention also reduces the effective resistance of the P body region between the source metallization and the anode of diode $D_1$ (FIGS. 6 and 7). By comparing the prior art device of FIG. 5 with the device of the present invention as shown in FIG. 11, it can be seen that the distance between the point at which the source metallization contacts the P+ body is closer to the channel section of the body region by approximately distance Y. Accordingly, the value of the resistance between the base and emitter junctions of the parasitic transistor ($R_1$ in FIG. 6, $R_2$ in FIG. 7) is reduced thereby reducing the likelihood that the transistor will turn on.

The present invention is equally applicable to lateral MOS devices such as depicted in FIG. 13. The structure includes P and P+ body diffusions 62 and 60 and an N+ source diffusion. The source diffusion includes a source contact section 64a and an intermediate section 64b. An N+ drain region 88 is formed near the top surface of the device, spaced apart from the channel section 62a by a drain drift region in the epitaxial layer 24. A drain metallization is laid over N+ region 88 to form a drain electrode 90.

The P+ section 62b extending through the N+ source region functions to increase the length of the electron current path between the source metallization 66 and P channel section, as previously described. Accordingly, a ballast voltage is produced which tends the reverse bias the base/emitter of the inherent parasitic transistor. In addition, the overall dimensions of the device are smaller than those of equivalent conventional devices, for the same reasons previously set forth in connection with vertical devices.

FIG. 14 is a simplified schematic representation of an equivalent circuit of a conventional four layer device, typically referred to as an insulated gate conductivity modulated device (IGCMD), which can utilizes the subject invention. The device depicted is roughly equivalent to an N channel MOS transistor 64 and a PNP transistor 94 with the drain of the MOS device coupled to the base of the transistor and the source connected to the collector. The source/collector electrode functions as the cathode of the IGCMD, with the emitter of the bipolar transistor serving as the anode and the MOS gate serving as the device gate. The IGCMD has an inherent parasitic bipolar transistor 92, with an effective resistance $R_2$ coupled between th base and emitter of the transistor.

Under normal operating conditions, a signal is applied to the gate of the IGCMD which causes the MOS transistor to turn on. The MOS transistor forward biases the base/emitter junction of transistor 94 and provides a current path for the base current. Thus, the total current flow through the IGCMD from the anode to cathode is the sum of the drain current of MOS transistor 64 and the collector current of transistor 94, with the collector current comprising the majority of the current.

When the gate signal causes the MOS transistor 96 to turn off, base current for transistor 94 can no longer flow so that the transistor will also shut off, thereby turning the entire device off. In the event parasitic transistor 92 is permitted to turn on, a base current path for transistor 94 will be present, even though MOS transistor 96 is off. The device will remain in a latched-up state and will eventually self-destruct. Thus, it is imperative that the parasitic transistor remain off.

A conventional four layer IGCMD is similar in construction to a conventional double diffused vertical N channel MOS device except that an extra conductivity layer is formed so as to form the emitter of the PNP transistor. An NPN transistor is formed in the event the MOS transistor is a P channel device.

FIG. 15 shows a cross-sectional view of a segment of an IGCMD incorporating the subject invention. A comparison between the FIG. 11 and FIG. 15 devices indicates that the IGCMD is formed by replacing the N+ layer 22 of FIG. 11 with a P+ layer 98. The cathode and anode electrodes are formed by metallizations 66 and 100, respectively, with the polysilicon gate 70 serving as the gate electrode. The remainder o the device is substantially identical to the previously-described vertical MOS device. The novel geometry functions to both reduce the value of $R_2$ (FIG. 14), and to provide a ballast voltage which tends to force parasitic transistor 92 to remain off.

Thus, a novel semiconductor device and method have been disclosed. Although several embodiments of the invention have been described in some detail, it is to be understood that various changes can be made by persons skilled in the art without departing from the spirit and scope of the invention as set forth in the appended claims.

I claim:

1. A monolithic semiconductor device comprising:
   a semiconductor body having a first major surface;
   a contiguous first region disposed in said semiconductor body of a first conductivity type, said first region including a channel section abutting said first surface, a first intermediate section spaced apart from said channel section and abutting said first surface and a body section disposed below said first surface and interconnecting said channel and said first intermediate sections;
   a contiguous second region disposed in said semiconductor body of a second conductivity type, opposite of said first conductivity type, said second region being bounded by said first region and including a peripheral section between said channel section and said first intermediate section, above said body section and abutting said first surface, a contact section abutting said first surface, and spaced part from said peripheral section, with said peripheral section and said contact section being disposed on opposite sides of said first intermediate section and interconnected by other first portions of said second region;
   an insulating layer positioned over said channel section on said first surface;
   a first electrode on said insulating layer above said channel section; and
   a first ohmic contact on said contact section so that at least part of current flow between said contact section and said peripheral section is around said first intermediate section and through said other first portions of said second region.

2. The semiconductor device of claim 1 further including a third region disposed in said semiconductor body of said second conductivity type which bounds said first region, said third region including a drift section adjacent said channel section, opposite said peripheral section.

3. The semiconductor device of claim 2 further including a second ohmic contact on said third region.

4. The semiconductor device of claim 3 wherein said third region includes a contact section abutting said first major surface, with said second ohmic contact disposed at said third region contact section.

5. The semiconductor device of claim 3 wherein said semiconductor body includes a second major surface, generally parallel to said first major surface, and wherein said third region includes a contact section abutting said second surface, with said second ohmic contact being disposed at said third region contact section.

6. The semiconductor device of claim 3 wherein said channel section of said first region and said peripheral section of said second region both extend around said contact section of said second region, with said first region further including a second intermediate section spaced apart from said first intermediate section and abutting said first surface between said peripheral section and said contact section of said second region, with other second portions of said second region interconnecting said contact section and said peripheral section so that at least part of current flow between said contact section and said peripheral section is around said second intermediate section and through said other second portions of said second region.

7. The semiconductor device of claim 6 wherein said first and second intermediate sections are disposed on opposite sides of said contact section of said second region.

8. The semiconductor device of claim 7 wherein said first and second conductivity types are P and N type, respectively.

9. The semiconductor device of claim 8 wherein said semiconductor body is comprised of a semiconductor substrate with an expitaxial layer on said substrate abutting said first major surfaces, with said first and second regions being disposed in said expitaxial layer.

10. The semiconductor device of claim 9 wherein said expitaxial layer is N type

11. The semiconductor device of claim 10 wherein said first electrode is polysilicon.

12. The semiconductor device of claim 11 wherein said device functions as a MOS transistor, with said first electrode functioning as a gate, said first ohmic contact including a second electrode which functions as a source and said second ohmic contact including a third electrode which functions as a drain.

13. The semiconductor device of claim 2 wherein said semiconductor device has a second major surface, generally parallel to said first major surface, and said semiconductor device further includes a fourth region disposed in said semiconductor body intermediate said third region and said second major surface, said fourth region being of said first conductivity type and including a contact section abutting said second major surface and a second ohmic contact disposed at said fourth region contact section.

14. The semiconductor device of claim 13 wherein said channel and peripheral sections both extend around said second region contact section, with said first region further including a second intermediate section spaced apart from said first intermediate section and abutting said first major surface between said peripheral section and said second region contact section, with other second portions of said second region interconnecting said second region contact section and said peripheral section so that at least part of current flow between said second region contact section and said peripheral section is around said second intermediate section and through said other second portions of said second region.

15. The semiconductor device of claim 14 wherein said device functions as an insulated gate conductivity modulated device, with said first and second conductivity types being of type P and N, respectively, said first electrode functioning as a gate, said first ohmic contact including a second electrode functioning as a cathode and said second ohmic contact including a third electrode functioning as an anode.

16. The semiconductor device of claim 15 wherein said first electrode in polysilicon.

17. The semiconductor device of claim 16 wherein said first and second intermediate sections of said first region are disposed on opposite sides of said second region contact section.

18. A monolithic semiconductor device comprising:
a semiconductor body having generally parallel first and second major surfaces and an expitaxial layer of a first conductivity type which abuts said first major surface;
a first contiguous region of a second conductivity type, disposed in said expitaxial layer, opposite of said first conductivity type, said first region including a channel section which extends around the periphery of said first region and abuts said first major surface and first and second intermediate sections, spaced apart from said channel section and one another and which abut said first major surface and a body section disposed below said first surface and interconnecting said channel with said first and intermediate sections;
a second contiguous region of said first conductivity type and bounded by said first region, said second region including a peripheral section and a contact section abutting said first major surface, with said peripheral section being disposed adjacent said channel section, extending around said contact section and above said body section, said contact section being disposed between said first and second intermediate sections and said contact section and said peripheral section being interconnected by other portions of said second region;
a third region of said first conductivity type which bounds said first region, said third region including a drift section, adjacent said channel section and opposite said peripheral section;
an insulating layer positioned over said channel section on said first major surface;
a first electrode on said insulating layer positioned over said channel section; and
a first ohmic contact on said second region contact section so that at least a part of the current flow between said second region contact section and said peripheral section is around said first and second intermediate sections and through said other portions of said second region.

19. The semiconductor device of claim 18 wherein said third region includes a contact section abutting said first major surface and a second ohmic contact on said contact section.

20. The semiconductor device of claim 19 wherein said device functions as a lateral MOS transistor, said first and second conductivity types are N and P, respectively, and said first electrode functions as a gate, said first ohmic contact includes a second electrode which functions as a source and said second ohmic contact includes a third electrode which functions as a drain.

21. The semiconductor device of claim 20 wherein said first electrode is polysilicon.

22. The semiconductor device of claim 18 wherein said third region includes a contact section abutting said second major surface and a second ohmic contact on said contact section.

23. The semiconductor device of claim 22 wherein said device functions as a vertical MOS transistor, said first and second conductivity types are N and P, respectively, and said first electrode functions as a gate, said first ohmic contact includes a second electrode which functions as a source and said second ohmic contact includes a third electrode which functions as a drain.

24. The semiconductor device of claim 18 further including a fourth region of said second conductivity type disposed between said third region and said second major surface, said fourth region including a contact section abutting said second major surface and a second ohmic contact on said contact section.

25. The semiconductor device of claim 24 wherein said device functions as an insulated gate conductivity modulated device with said first and second conductivity types being type N and P, respectively, said first electrode functioning as a gate, said first ohmic contact including a second electrode which functions as a cathode and said second ohmic contact includes a third electrode which functions as an anode.

26. The semiconductor device of claim 12 wherein said second electrode extends between said first and second intermediate sections and over said contact section of said second region so as to electrically interconnect said first and second intermediate sections and said second region contact section at said first surface.

27. The semiconductor device of claim 17 wherein said second electrode extends between said first and second intermediate sections and over said second region contact section so as to electrically interconnect said first and second intermediate sections and said second region contact section at said first surface.

28. The semiconductor device of claim 20 wherein said second electrode extends between said first and second intermediate sections and over said contact section of said second region so as to electrically interconnect said first and second intermediate sections and said second region contact section at said first surface.

29. The semiconductor device of claim 23 wherein said second electrode extends between said first and second intermediate sections over said contact section of said second region so as to electrically interconnect said first and second intermediate sections and said second region contact section at said first surface.

30. The semiconductor device of claim 25 wherein said second electrode extends between said first and second intermediate sections over said contact section of said second region so as to electrically interconnect said first and second intermediate sections and said second region contact section at said first surface.

* * * * *